(12) United States Patent
Dei

(10) Patent No.: US 6,219,364 B1
(45) Date of Patent: Apr. 17, 2001

(54) SEMICONDUCTOR LASER MODULE HAVING IMPROVED METAL SUBSTRATE ON PELTIER ELEMENT

(75) Inventor: Yoshihiro Dei, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/005,160

(22) Filed: Jan. 9, 1998

(30) Foreign Application Priority Data

Jan. 9, 1997 (JP) .................................................. 9-002115

(51) Int. Cl.⁷ ........................................................ H01S 3/04
(52) U.S. Cl. ................................................. 372/36; 372/34
(58) Field of Search ................................... 372/34, 36, 43

(56) References Cited

U.S. PATENT DOCUMENTS

| 4,661,959 | * | 4/1987 | Kaneko | 372/34 |
| 4,998,256 | * | 3/1991 | Ohshima et al. | 372/34 |
| 5,436,920 | * | 7/1995 | Minemoto et al. | 372/66 |

FOREIGN PATENT DOCUMENTS

| 0 477 841 A2 | 4/1992 | (EP) . |
| 0 590 232 A1 | 4/1994 | (EP) . |
| 62-117382 | 5/1987 | (JP) . |
| 62-276892 | 12/1987 | (JP) . |
| 1-243488 | 9/1989 | (JP) . |
| 2-102756 | 8/1990 | (JP) . |
| 4-240607 | 8/1992 | (JP) . |
| 5-96810 | 12/1993 | (JP) . |
| 7-131112 | 5/1995 | (JP) . |

OTHER PUBLICATIONS

Office Action issued by Japanese Patent Office, Jul. 13, 1999 (including partial English translation).
Patent Abstracts of Japan, vol. 012, No. 167.

* cited by examiner

*Primary Examiner*—Teresa M. Arroyo
*Assistant Examiner*—Davienne Monbleau
(74) *Attorney, Agent, or Firm*—Sughrue, Mion, Zinn, Macpeak & Seas, PLLC

(57) ABSTRACT

In a semiconductor laser module including a laser diode chip, a metal substrate for mounting the laser diode chip thereon, and a Peltier element having a panel coupled by metal solder to the metal substrate, the metal substrate is formed by a first metal member having a larger thermal conductivity than about 290 W/m·deg and a second metal member having a thermal expansion coefficient close to that of the panel.

18 Claims, 7 Drawing Sheets

Fig. 4A

| METAL | | THERMAL CONDUCTIVITY (W/m·deg) | THERMAL EXPANSION COEFFICIENT (×10⁻⁶/deg) |
|---|---|---|---|
| TUNGUSTEN | (W) | 17 | 4.5 |
| KOVAR | (Kovar) | 17 | 5.3 |
| IRON | (Fe) | 75 | 11.7 |
| 20% COPPER MOLYBDENUM | (CMC-20) | 200 | 8.0 |
| 10% COPPER TUNGSTEN | (CuW-10) | 210 | 6.5 |
| 15% COPPER TUNGSTEN | (CuW-15) | 230 | 7.0 |
| 20% COPPER TUNGSTEN | (CuW-20) | 250 | 8.5 |
| 30% COPPER TUNGSTEN | (CuW-30) | 290 | 10.9 |
| COPPER | (Cu) | 390 | 16.5 |

Fig. 4B

| CERAMIC | | THERMAL CONDUCTIVITY (W/m·deg) | THERMAL EXPANSION COEFFICIENT ($\times 10^{-6}$/deg) |
|---|---|---|---|
| ALUMINA | ($Al_2O_3$) | 17 | 6.7 |
| ALUMINUM NITRIDE | (AlN) | 200 | 4.5 |
| SILICON CARBIDE | (SiC) | 270 | 3.7 |
| BORON NITRIDE | (BN) | 600 | 3.7 |

SEMICONDUCTOR LASER MODULE HAVING IMPROVED METAL SUBSTRATE ON PELTIER ELEMENT

BACKGROUND OF THE INVENTION

1. Field of the Invention

The present invention relates to a semiconductor laser module with a cooler system using a Peltier element, and more particularly, to the improvement of a metal substrate secured on the Peltier element.

2. Description of the Related Art

Semiconductor laser modules are currently used for optical fiber telecommunications particularly as signal light sources of cable televison (cATV) systems and excitation light sources of fiber amplifiers. Such semiconductor laser modules typically contain a Peltier element that operates as an electronic cooler in order to realize a high output power and stable operation of the module and a metal substrate is mounted onto the top of the Peltier element such that optical components such as a laser diode chip, a photodiode chip and/or a lens and electric components such as a thermistor, inductors and/or resistors are arranged on the metal substrate.

Such semiconductor laser modules are so configured as to cool the entire metal substrate and maintain the temperature of the laser diode chip to a constant level by detecting the temperature by means of the thermistor bonded near the laser diode chip and feeding back the detected temperature to the Peltier element to drive the latter.

Semiconductor laser modules using a Peltier element as a cooler are disclosed, inter alia, in JP-A62-117382 and JP-A-62-276892.

In a prior art semiconductor laser module, the metal substrate is made of a single metal having a large thermal conductivity. On the other hand, the ceramic panel is made of a ceramic having a small thermal expansion coefficient. In this case, in order to enhance the power output capability of the semiconductor laser module, the metal substrate is preferably made of a metal having a much larger thermal conductivity, to enhance the heat radiating effect. This will be explained later in detail.

In the above-described prior art semiconductor laser module, however, there is a large difference in thermal expansion coefficient between the metal substrate and the ceramic panel. Therefore, the metal substrate and the ceramic panel are subjected to large thermal stress. As a result, the Peltier element can become destroyed in a thermal environment test involving rapid temperature changes.

SUMMARY OF THE INVENTION

It is an object of the present invention to provide a semiconductor laser module including a Peltier element that has an enhanced cooling potential when operating for a high power output level and is made less vulnerable to damage in a thermally harsh environment by making the panel of the Peltier element and the metal substrate arranged on top of it show a small difference in expansion coefficient.

According to the present invention, in a semiconductor laser module including a laser diode chip, a metal substrate for mounting the laser diode chip thereon, and a Peltier element having a panel coupled by metal solder to the metal substrate, the metal substrate is formed by a first metal member having a larger thermal conductivity than about 290 W/m·deg and a second metal member having a thermal expansion coefficient close to that of the panel.

BRIEF DESCRIPTION OF THE DRAWINGS

The present invention will be more clearly understood from the description as set forth below, as compared with the prior art, with reference to the accompanying drawings, wherein:

FIG. 4A is a table showing the characteristics of metals;

FIG. 4B is a table showing the characteristics of ceramics;

DESCRIPTION OF THE PREFERRED EMBODIMENTS

Before the description of the preferred embodiments, a prior art semiconductor laser module will be explained with reference to FIGS. 1, 2, 3A and 3B.

Figure 1:
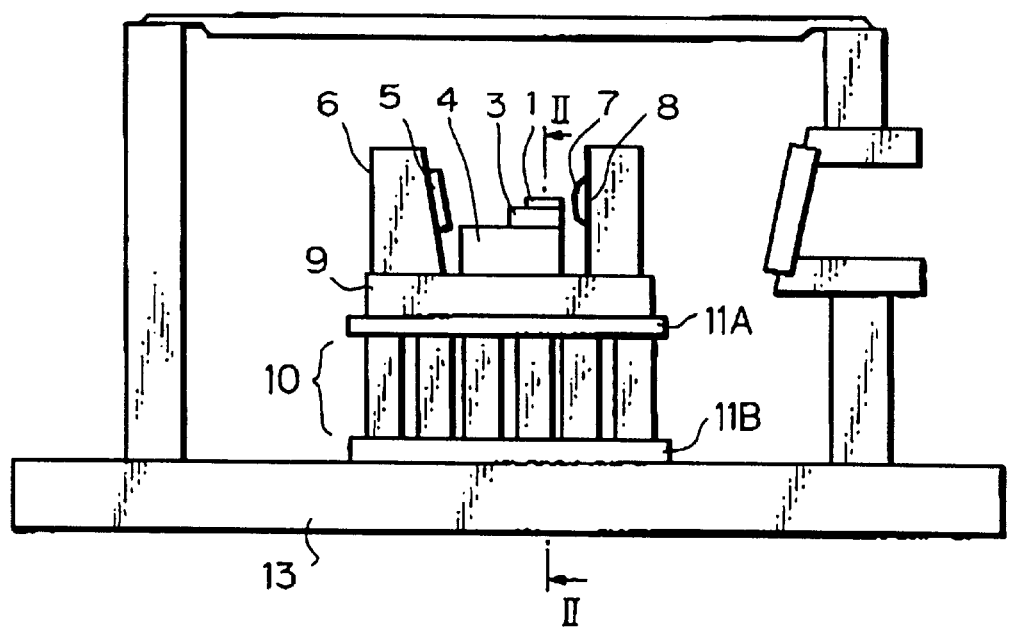
FIG. 1 is a schematic lateral view illustrating a prior art semiconductor laser module.
Figure 2:
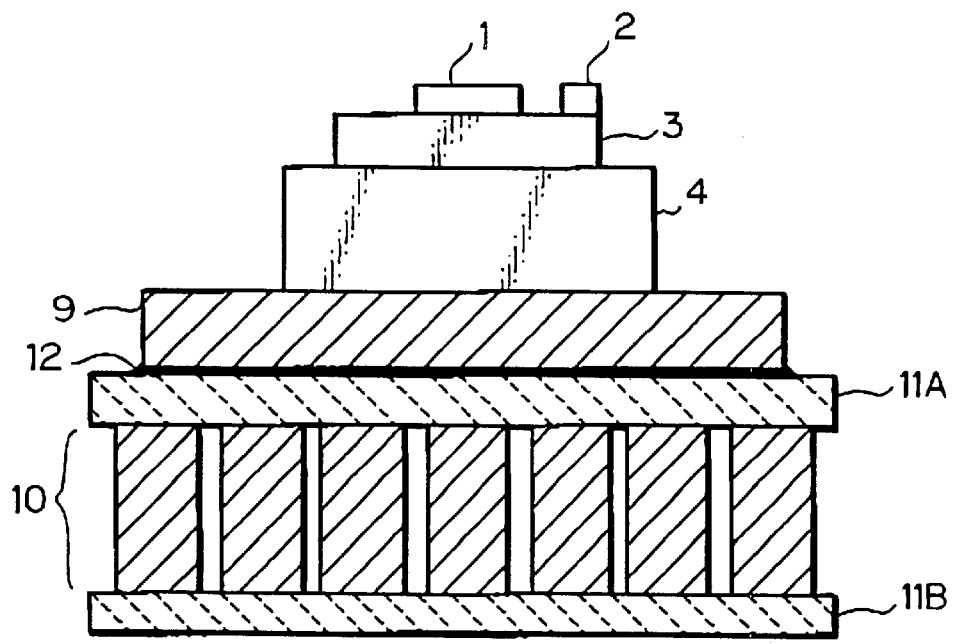
FIG. 2 is an enlarged cross-sectional view taken along the line II—II of FIG. 1.

FIG. 1, is a schematic lateral view illustrating a prior art semiconductor laser module, and FIG. 2 is an enlarged cross-sectional view taken along the line II—II of FIG. 1. In FIGS. 1 and 2, a laser diode chip 1 and a thermister 2 are mounted via a heat sink 3 on a sub mount 4. Also, a monitor photodiode chip 5 is mounted on a chip carrier 6. Further, a lens 7 is mounted on a lens holder 8. The sub mount 4, the chip carrier 6 and the lens holder 8 are mounted on a metal substrate 9 to which resistors, inductors, circuit boards are adhered.

On the other hand, a Peltier element 10 is sandwiched by ceramic panels 11A and 11B. The ceramic panels 11A is adhered to the metal substrate 9 by cold soft metal solder 12 made of indium tin (InSn) to alleviate the difference in thermal expansion therebetween. Also, the ceramic panel 11B is adhered by metal solder (not shown) to a package heat-radiating panel 13.

Figure 3A:
FIGS. 3A and 3B are perspective views of examples of the metal substrate of FIGS. 1 and 2.
Figure 3B:
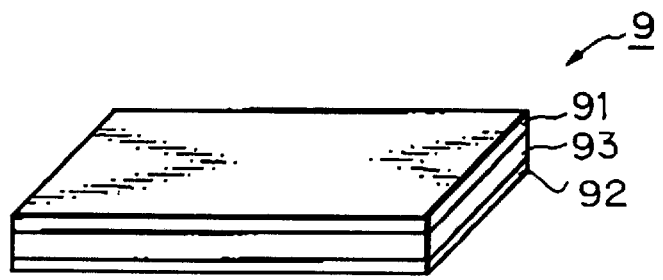

In FIG. 3A, which illustrates an example of the metal substrate 9 of FIGS. 1 and 2, the metal substrate 9 is made of a single metal material such as Kovar or copper tungsten, to simplify the manufacturing process. Also, in FIG. 3B, which illustrates another example of the metal substrate 9 of FIGS. 1 and 2, the metal substrate 9 is constructed by a triple-layered structure formed by copper layers 91 and 92 with a 20 percent copper molybdenum layer 93 sandwiched by the copper layers 91 and 92.

Usually, the metal substrate 9 is made of a metal having a large thermal conductivity, such as copper tungsten (CuW) containing copper typically between 10 wt % and 30 wt % or copper (Cu)(see FIG. 4A). On the other hand, the ceramic panel 11A (11B) is made of a ceramic having a small thermal expansion coefficient, such as alumina ($Al_2O_3$) or aluminum nitride (AlN) (see FIG. 4B).

Incidentally, as semiconductor laser diode chips with a higher power output capability have become available in recent years, a cooler system is required to have an enhanced cooling potential of the Peltier element 10. Therefore, the metal substrate 9 is preferably made of a metal having a much larger thermal conductivity, such as CuW-30 or Cu (see: FIG. 4A). In this case, there is a large difference in thermal expansion coefficient between the metal substrate 9 and the ceramic panel 11A (alumina). As a result, the metal substrate 9 and the ceramic panel 11A are subjected to large thermal stress due to a reduced temperature regulating time (the time required for it to get to an aimed temperature level) that results from the enhanced cooling potential. This creates a solder creep phenomenon in the soft metal solder 12. Therefore, a hard metal solder made of bismuth tin (BiSn) will have to be used instead of the soft metal solder 12.

If, however, the cold hard solder is used, and a difference in thermal expansion coefficient between the Peltier element 10 (more exactly, the ceramic panels 11A and 11B) and the metal substrate 9 show a large difference, the Peltier element 10 can become destroyed in a thermal environment test involving rapid temperature changes such as a Peltier ON/OFF test so that the ceramic panels 11A and 11B of the Peltier element 10 and the metal substrate 9 will have to be made of materials that show a difference of thermal expansion coefficient that is by far less than the difference of thermal expansion coefficient of known combinations of materials for the ceramic panels 11A and 11B and the metal substrate 9.

In order for a combination of the Peltier element 10 (the ceramic panels 11A and 11B) and the metal substrate 9 to improve the reliability in a harsh thermal environment without passing a thermal environment test, they have to show a small difference of expansion coefficient and, at the same time, to be structured to show small dimensions at the cost of cooling potential.

If the metal substrate 9 is replaced by a ceramic substrate made of silicon carbide (SiC) or boron nitride (BN), its substrate shows a good thermal conductivity and, at the same time, a thermal expansion coefficient close to that of the material ($Al_2O_3$ or AlN) of the ceramic panels 11A and 11B of the Peltier element 10 (see; FIG. 4B); however, in this case, the materials SiC and BN are costly and not adapted to mass production.

In short, any attempts at enhancing the cooling potential and, at the same time, improving the reliability for operating in a thermally harsh environment for semiconductor laser modules provided with a cooler have been futile.

Figure 5:
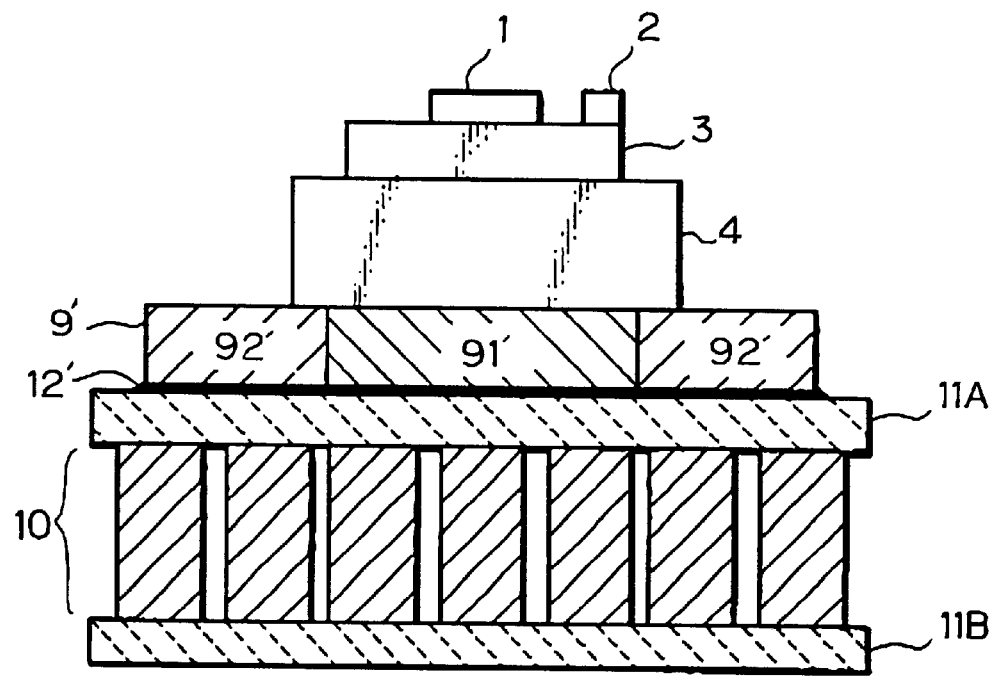
FIG. 5 is a cross-sectional view illustrating a first embodiment of the semiconductor laser module according to the present invention.

In FIG. 5, which illustrates a first embodiment of the present invention, the metal substrate 9 of FIG. 2 is replaced by a metal substrate 9' formed by a metal member 91' and a metal member 92' surrounding the metal member 91' as illustrated in FIG. 5. The metal substrate 9' is bonded by a hard metal solder 12' onto the top of the Peltier element 10, i.e., the ceramic panel 11A in such a way that it lies perpendicularly relative to the direction along which heat flows from the laser diode chip 1 to the Peltier element 10.

The metal member 91' is made of a metal having a thermal conductivity larger than about 290 W/m·deg, such as CuW-30 or Cu (see; FIG. 4A). On the other hand, the metal member 92' is made of a metal having a small thermal expansion coefficient close to that of the ceramic panel 11A.

For example, the thermal expansion coefficient of the metal member 92' is smaller than about $8.5 \times 10^{-6}$ /deg, and, in this case, the metal member 92' is made of W, Kovar, CMC-20, CuW-10, CuW-15 or, CuW-20 (see FIG. 4A)

When a semiconductor laser module having a configuration as described above is driven to operate, the temperature of the laser diode chip 1 is sensed by the thermistor 2, and the Peltier element 10 is fed with power under the control of a temperature control circuit arranged outside the semiconductor laser module that is provided with a cooling feature, to keep the temperature of the laser diode chip 1 to a constant level. Note that the laser diode chip 1 operates well when the ambient temperature is low and is normally held to room temperature.

If, on the other hand, the laser diode chip 1 is made to show a high power output level and accordingly emit heat at an enhanced rate, the Peltier element 10 has to be driven more vigorously and the thermal resistance of the heat discharge route from the laser diode chip 1 to the package heat radiating panel 13 has to be made as low as possible.

Figure 7:
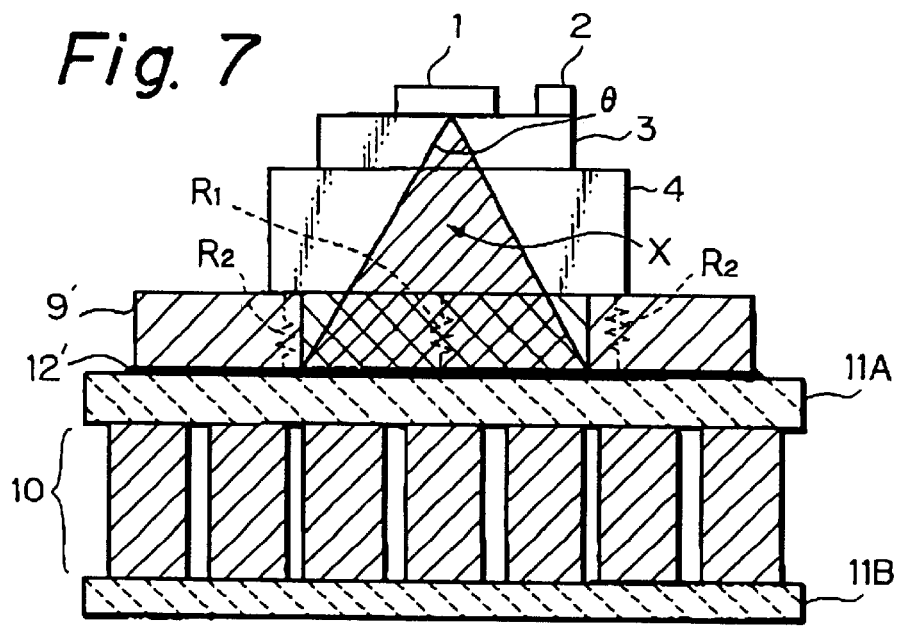
FIG. 7 is a cross-sectional view illustrating the heat radiating effect of the semiconductor laser module of FIG. 5.

In FIG. 7, which shows the heat radiating effect of the semiconductor laser module of FIG. 5, the heat generated by the laser diode chip 1 is transmitted with a spreading angle $\Theta$ (theoretically 90°) to the top of the Peltier element 10 by way of the heat sink 3, the submount 4 and the metal substrate 9'. If the metal member 91' has a surface area greater than a spreading heat flow range that gets to it, the cooling effect of the module will be satisfactory. However, if the module is expected to show a large thermal expansion that can damage the reliability of the module, the ratio of the surface area of the metal member 91' to that of the metal member 92' has to be made small to make the thermal conductivity of the metal substrate 9' within the area where it is bonded to the submount 4 lower than a predetermined level. References $R_1$ and $R_2$ respectively denote the thermal resistances of the metal members 91' and 92', respectively, which will be described in greater detail hereinafter.

Note that the metal members 91' and 92' are arranged perpendicularly relative to the direction along which heat flows from the laser diode chip 1 to the peltier element 10.

Figure 8:
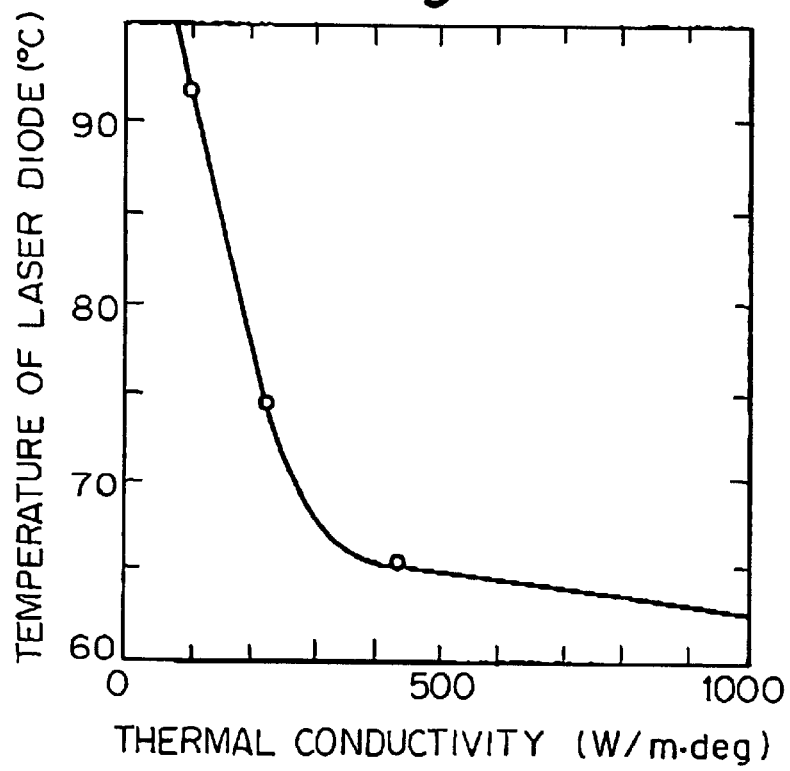
FIG. 8 is a graph showing the temperature characteristics of the semiconductor laser module to the thermal conductivity of the metal substrate of FIG. 5.

FIG. 8 is a graph showing a simulated relationship between the thermal conductivity of the heat radiating material and the temperature of the laser diode chip 1 of FIG. 5. This graph is obtained by simulating the operation of the laser diode chip 1 driven with power of 1W to show the relationship between the thermal conductivity of the heat radiating material and the temperature of the laser diode chip 1. According to this simulation, the chip temperature can be reduced effectively by using a material having a thermal conductivity of about 290 W/m·deg or more. Therefore, the metal substrate 9' to be mounted on a Peltier element has to be made of a material with a thermal conductivity greater than 30% copper tungsten (CuW-30)(see FIG. 4A) in order to make the module operate with an improved cooling effect.

However, the ceramic panels 11A and 11B of the Peltier element 10 are made of a ceramic material selected from the list of FIG. 4B particularly, $Al_2O_3$ or AlN, Since the materials of FIG. 4B have a thermal expansion coefficient smaller than that of the material of the metal substrate 9', a relatively large stress can be generated when the temperature fluctuates remarkably which degrades and eventually destroy the Peltier element 10 if they are bonded by means of metal hard solder.

Figure 6:
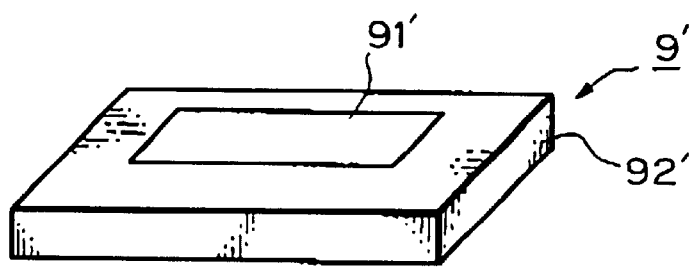
FIG. 6 is a perspective view of the metal substrate of FIG. 5.

Therefore, in FIGS. 5 and 6, the metal substrate 9' is formed by arranging the metal member 92' having a small thermal expansion coefficient around the lateral periphery of the metal member 91' having a large thermal conductivity in order to reduce the thermal expansion and raise the thermal conductivity of the entire metal substrate 9'. With this arrangement, the cooling potential and the reliability of the Peltier element 10 are improved.

Now, examples of materials that can be used for the metal substrate 9' will be described. The metal member 91' may be made of copper (Cu) having a large thermal conductivity (390 W/m·deg) as shown in FIG. 4A while the metal member 92' may be made of 10% copper tungsten (CuW-10) having a small thermal expansion coefficient ($6.5 \times 10^{-6}$/deg) as shown in FIG. 4B. Then, the two metal members 91' and 92' may be bonded together to form a metal substrate 9' by brazing or by means of a penetrant. Or the metal member 91' may be formed as a block at the time when 10% copper tungsten is prepared. The ratio of the surface area of the metal member 91' (Cu) to that of the entire metal substrate 9' is determined as a function of the thermal resistance $R_2$ of the metal member 91' (CuW-10) and the permissible thermal expansion coefficient of the entire metal substrate 9'. The permissible thermal expansion coefficient of the entire metal substrate 9' can vary as a function of the bonded area, the thermal environment and the hardness and height of the hard metal solder 12'.

Note that, as described above, if the reliability of the Peltier element 10 is questionable, the surface area of the metal member 91' (Cu) relative to that of the entire metal substrate 9' may be reduced to raise the thermal conductivity of the area of the metal substrate 9' bonded to the submount 4 above about 290 W/m·deg.

If the thermal resistance $R_2$ of the 10% copper tungsten in the area where the submount 4 is bonded to the metal substrate 9' is Rcw (deg/W) and the thermal resistance $R_1$ of the copper is Rcc (deg/W), the thermal conductivity λ (W/m·deg) of the area of the metal substrate 9' bonded to the submount 4, RcW and Rcc are expressed respectively by the formulas below.

$$\lambda = (1/Rcw) + (1/Rcc),$$

$$Rcw = (1/\lambda cw) \times (L/Scw),$$

and $$Rcc = (1/\lambda cc) \times (L/Scc),$$

where λcw, Scw, λcc, Scc and L are defined as follow:

λcw: the thermal conductivity (W/m·deg) of CuW-10,

Scw: the area ($m_2$) of CuW-10 bonded to the submount 4,

λcc: the thermal conductivity (W/m·deg) of copper,

Scc: the area of the copper bonded to the submount 4 ($m^2$) and

L: the thickness of the metal substrate 9' (m).

Then, the area Scc of copper bonded to the submount 4 may be determined so as to make $\lambda \geq 290$.

In the above-described example, the metal member 91' having a thermal conductivity greater than 30% copper tungsten (Cuw-30) is surrounded along the peripheral wall thereof by the metal member 92' having a thermal expansion coefficient between Kovar and 20% copper tungsten (CuW-20) to form the metal substrate 9', which is then bonded to the ceramic panel 11A of the Peltier element 10 to produce a semiconductor laser module. With this arrangement, the heat generated by the laser diode chip 1 is mostly transmitted to the metal substrate 9' by way of the heat sink 3 located right under it and the submount 4. The transmitted heat is then transferred from the top to the bottom of the Peltier element 10 and eventually radiated to the outside through the package heat radiating panel 13.

In short, by arranging a metal member having a small thermal expansion coefficient around another metal member having a large thermal conductivity, heat flows mostly through the metal member having a large thermal conductivity so that the first embodiment shows a reliable thermal conductivity at high temperature to improve the cooling effect of the Peltier element 10. Additionally, if the temperature fluctuates, the thermal expansion of the metal member having a large thermal conductivity is suppressed by the metal member having a small thermal expansion coefficient so that a feature of low thermal expansion is maintained to improve its reliability in a thermally harsh environment where temperature fluctuates significantly.

Figure 9:
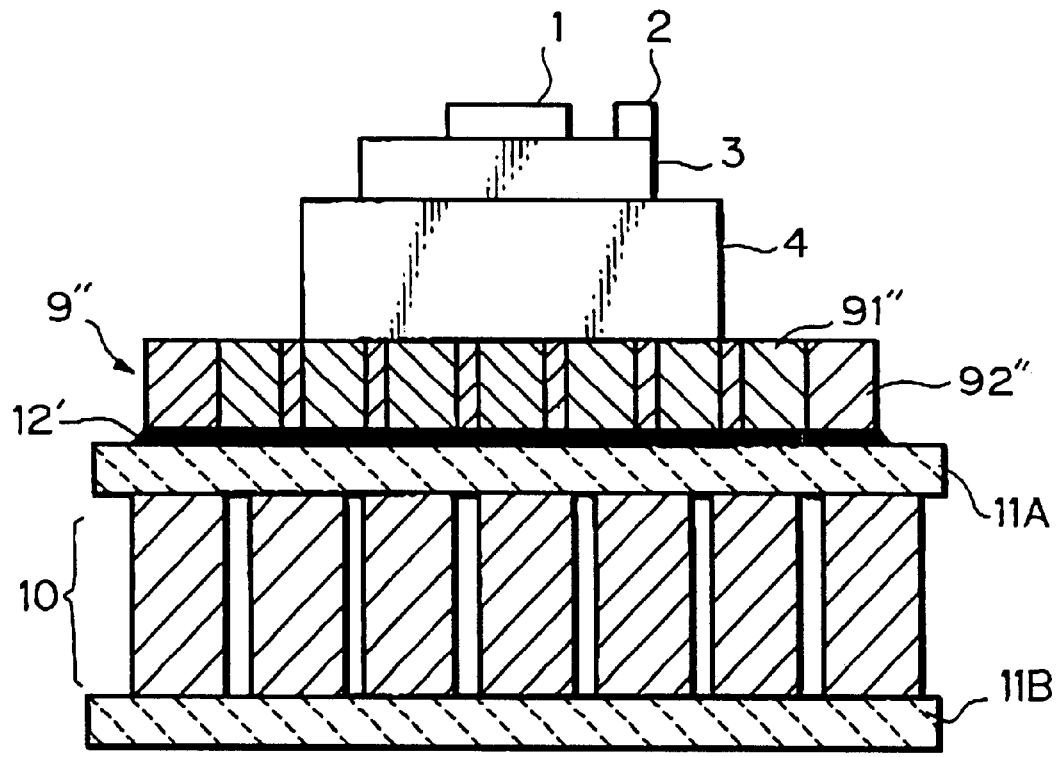
FIG. 9 is a cross-sectional view illustrating a second embodiment of the semiconductor laser module according to the present invention.
Figure 10:
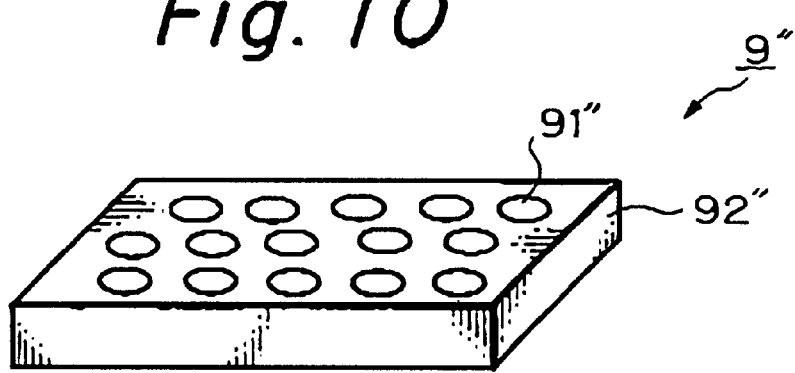
FIG. 10 is a perspective view of the metal substrate of FIG. 9.

In FIG. 9, which illustrates a second embodiment of the present invention, the metal substrate 9 of FIG. 2 is replaced by a metal substrate 9" formed by metal members 91" and a metal member 92". The metal members 91" are made of the same material as that of the metal member 91' of FIG. 5, and the metal member 92" is made of the same material as that of the metal member 92'. That is, as illustrated in FIG. 10, the metal members 91" are arranged in an array over the entire area of the metal member 92" at regular intervals to produce the metal substrate 9". The dimensions and the number of the metal members 91" may be determined in a manner as described above by referring to the first embodiment.

Thus, the second embodiment is advantageous over the first embodiment in that the thermal expansion coefficient of the entire semiconductor laser module can be reduced further from the first embodiment by dividing the metal members 91" into a number of pieces and arranging them longitudinally such that the metal members 91" and the metal member 92" are located in parallel along the direction of the heat flow originating from the laser diode chip 1.

As explained hereinabove, according to the present invention, since the metal substrate includes a large thermal conductivity metal, the metal substrate itself shows a large thermal conductivity, so that the heat generated by the laser diode can be effectively radiated, thus enhancing a cooling potential. Additionally, since the metal substrate includes a small thermal expansion coefficient metal, the difference in thermal expansion coefficient between the metal substrate and the ceramic panel of the Peltier element is reduced. As a result, the stress of the Peltier element due to temperature changes can be reduced so that the Peltier element is protected against degradation and destruction to show an enhanced level of reliability even in a thermally harsh environment where the temperature fluctuates significantly.

What is claimed is:

1. A semiconductor laser module comprising:

a laser diode chip;

a metal substrate for mounting said laser diode chip thereon; and a Peltier element having a panel coupled by metal solder to said metal substrate, said metal substrate comprising a first metal member having a thermal conductivity larger than about 290 W/m·deg and a second metal member having a thermal expansion coefficient closer to a thermal expansion coefficient of said panel than a thermal expansion coefficient of said first metal member, such that said second metal member constrains thermal expansion of said first metal member in a plane of expansion, wherein the plane of expansion is parallel to a surface of said panel of said Peltier element to which said metal substrate is coupled, and intersects both said first metal member and said second metal member together.

2. The semiconductor laser module as set forth in claim 1, wherein said second metal member is arranged around a peripheral wall of said first metal member.

3. The semiconductor laser module as set forth in claim 1, wherein said first metal member is divided into a plurality of pieces arranged in an array over said second metal member at regular intervals.

4. The semiconductor laser module as set forth in claim 1, wherein said first and second metal members are arranged in parallel with a direction of heat flow generated from laser diode chip.

5. The semiconductor laser module as set forth in claim 1, wherein said first metal member is made of one of 30 percent copper tungsten and copper.

6. The semiconductor laser module as set forth in claim 1, wherein said panel is made of ceramic.

7. The semiconductor laser module as set forth in claim 6, wherein said ceramic is one of alumina and aluminum nitride.

8. The semiconductor laser module as set forth in claim 7, wherein said second metal member has a thermal expansion coefficient from about $4.5 \times 10^{-6}$/deg to about $8.5 \times 10^{-6}$/deg.

9. The semiconductor laser module as set forth in claim 8, wherein said second metal member is made of one of tungsten Kovar, 20 percent copper molybdenum, 10 percent copper tungsten, 15 percent copper tungsten and 20 percent copper tungsten.

10. A semiconductor laser module comprising:
   a Peltier element having a panel;
   a metal substrate coupled by metal solder to said panel;
   a submount fixed on said metal substrate;
   a heat sink mounted on said submount;
   a laser diode chip adhered to said heat sink; and
   a thermistor adhered to said heat sink,
   said metal substrate comprising a first metal member having a thermal conductivity larger than about 290 W/m·deg and a second metal member having a thermal expansion coefficient closer to a thermal expansion coefficient of said panel than a thermal expansion coefficient of said first metal member, such that said second metal member constrains thermal expansion of said first metal member in a plane of expansion,
   wherein the plane of expansion is parallel to a surface of said panel of said Peltier element to which said metal substrate is coupled, and intersects both said first metal member and said second metal member together.

11. The semiconductor laser module as set forth in claim 10, wherein said second metal member is arranged around a peripheral wall of said first metal member.

12. The semiconductor laser module as set forth in claim 10, wherein said first metal member is divided into a plurality of pieces arranged in an array over said second metal member at regular intervals.

13. The semiconductor laser module as set forth in claim 10, wherein said first and second metal members are arranged in parallel with a direction of heat flow generated from said laser diode chip.

14. The semiconductor laser module as set forth in claim 10, wherein said first metal member is made of one of 30 percent copper tungsten and copper.

15. The semiconductor laser module as set forth in claim 10, wherein said panel is made of ceramic.

16. The semiconductor laser module as set forth in claim 15, wherein said ceramic is one of alumina and aluminum nitride.

17. The semiconductor laser module as set forth in claim 16, wherein said second metal member has a thermal expansion coefficient from about $4.5 \times 10^{-6}$/deg to about $8.5 \times 10^{-6}$/deg.

18. The semiconductor laser module as set forth in claim 17, wherein said second metal member is made of one of tungsten Kovar, 20 percent copper molybdenum, 10 percent copper tungsten, 15 percent copper tungsten and 20 percent copper tungsten.

* * * * *